US010914897B2

(12) United States Patent
Ding et al.

(10) Patent No.: US 10,914,897 B2
(45) Date of Patent: Feb. 9, 2021

(54) OPTICAL ON-WAFER PROBING WITH V-GROOVE COUPLERS

(71) Applicant: GLOBALFOUNDRIES INC., Grand Cayman (KY)

(72) Inventors: Hanyi Ding, Colchester, VT (US); John Ferrario, Waterbury, VT (US); John Joseph Cartier, Bridport, VT (US); Benjamin Michael Cadieux, Shelburne, VT (US)

(73) Assignee: GlobalFoundries Inc., Grand Cayman (KY)

( * ) Notice: Subject to any disclaimer, the term of this patent is extended or adjusted under 35 U.S.C. 154(b) by 52 days.

(21) Appl. No.: 16/217,838

(22) Filed: Dec. 12, 2018

(65) Prior Publication Data

US 2020/0192033 A1 Jun. 18, 2020

(51) Int. Cl.
*G02B 6/36* (2006.01)
*G02B 6/30* (2006.01)
*G02B 6/35* (2006.01)

(52) U.S. Cl.
CPC ............. *G02B 6/3624* (2013.01); *G02B 6/30* (2013.01); *G02B 6/3636* (2013.01); *G02B 6/3502* (2013.01)

(58) Field of Classification Search
CPC ...... G02B 6/3624; G02B 6/3636; G02B 6/30; G01R 1/071
See application file for complete search history.

(56) References Cited

U.S. PATENT DOCUMENTS

| 5,101,453 | A | * | 3/1992 | Rumbaugh | ........... G02B 6/3624 385/12 |
| 5,271,734 | A | * | 12/1993 | Takeuchi | .............. A61C 19/043 433/29 |
| 5,631,571 | A | | 5/1997 | Spaiziani et al. | |
| 6,970,634 | B2 | * | 11/2005 | McCann | .............. G02B 6/4292 356/241.1 |

(Continued)

OTHER PUBLICATIONS

Albares et al., "Optical Fiber to Waveguide Coupling Technique," Mar. 1990, Report TR 1337.

(Continued)

*Primary Examiner* — Ryan A Lepisto
*Assistant Examiner* — Erin D Chiem
(74) *Attorney, Agent, or Firm* — Paul Frank + Collins P.C.

(57) ABSTRACT

A probe device is configured to insert optical fiber probes directly into a v-groove coupler on an optical integrated circuit (IC) device. The probe device may include a probe holder comprising with a slot. A fiber holder may insert into the slot. The fiber holder may comprise a body with a first portion and second portion disposed at an angle relative to one another so that the first portion is shorter than the second portion. The body may have a bottom with grooves disposed therein, the grooves having dimensions to receive part of an optical fiber probes therein. In use, the fiber holder can arrange the optical fiber probes to extend into the v-grooves of the v-groove coupler of an optical IC on a wafer. The device may incorporate an alignment mechanism that permits the fiber holder to move or "self-align" in response to contact between the optical fiber probes and structure of the v-groove coupler of an optical IC on a wafer.

14 Claims, 11 Drawing Sheets

(56) References Cited

U.S. PATENT DOCUMENTS

| | | | |
|---|---|---|---|
| 7,020,363 B2 | 3/2006 | Johannessen | |
| 7,183,759 B1 * | 2/2007 | Malendevich | G02B 6/12007 |
| | | | 324/750.22 |
| 7,876,114 B2 * | 1/2011 | Campbell | G01R 1/06772 |
| | | | 324/754.06 |
| 2005/0047715 A1 | 3/2005 | Lam et al. | |
| 2007/0276292 A1 * | 11/2007 | Hansma | A61B 5/4504 |
| | | | 600/587 |

OTHER PUBLICATIONS

Michael et al, "An Optical Fiber Taper Probe for Wafer Scale Microphotonic Device Characterization", Apr. 16, 2007; Optics Express, vol. 15, No. 8; Optical Society of America.

Taillaert et al., "Grating Couplers for Coupling Between Optical Fibers arid Nanophotonic Waveguides," Japanese Journal of Applied Physics, vol. 45, No. 8A, p. 6071-6077, 2006.

Wirth, Justin C., "Silicon Grating Couplers for Low Loss Coupling Between Optical Fiber and Silicon Nanowires," Dec. 2011, Purdue University.

* cited by examiner

OPTICAL ON-WAFER PROBING WITH V-GROOVE COUPLERS

BACKGROUND

On-wafer device testing is an integral step in most wafer fabrication and production processes. The process often employs equipment that can test functionality of individual integrated circuit (IC) devices on the wafer. This equipment includes a probe that can exchange a stimuli with the IC or IC device that is under test (the "device-under-test" or "DUT"). For optical IC devices, the probe stimuli may embody an optical signal, like light. The probe may include optical fibers or optics (or lenses) to deliver the optical signal into the IC device and to receive corresponding response from the IC device. In use, optical fibers may insert into an opening on an edge of a chip IC diced from the wafer. Alternative processes may have the optical fibers interface with vertical grating couplers (or like interfacing elements) on the IC device, typically prior to dicing to separate the chip IC from the wafer. Arrangements of lenses may actually insert into discrete regions (or recesses) in the wafer structure to interface with the IC devices, but it may require relatively large space or spacing and significant effort for multiple channels.

SUMMARY

This disclosure describes subject matter that relates to optical probing solutions for optical integrated circuits (IC). Of particular interest herein are embodiments that can locate optical fibers into optical ICs that reside inwardly from the edge of the wafer. These embodiments may leverage a probe device that can insert the optical fibers into "v-groove" couplers, which typically operate as optical input/outputs (I/Os) for the optical IC devices. This probe device maintains integrity of the optical signals because the optical fiber "directly" interfaces with the IC structure. The proposed solution also forecloses the need to add or design additional structure (e.g., vertical grating couplers) to the optical IC device. As an added benefit, use of the probe solution contemplated herein allows wafer production to fabricate the v-groove couplers without intervening steps that stop production for wafer-level sorting tests.

DRAWINGS

Reference is now made briefly to the accompanying drawings, in which:

FIG. 1 depicts a schematic diagram of an exemplary embodiment of a probe device for on-wafer testing of optical integrated circuitry;

FIG. 2 schematically depicts an elevation view from the side of an example of a fiber holder for use in the probe device of FIG. 1;

FIG. 3 schematically depicts a plan view from the bottom of the fiber holder of FIG. 2;

FIG. 4 schematically depicts an elevation view from the front of the fiber holder of FIG. 2;

FIG. 5 schematically depicts an elevation view of the cross-section of the fiber holder of FIG. 4;

Figure 1:
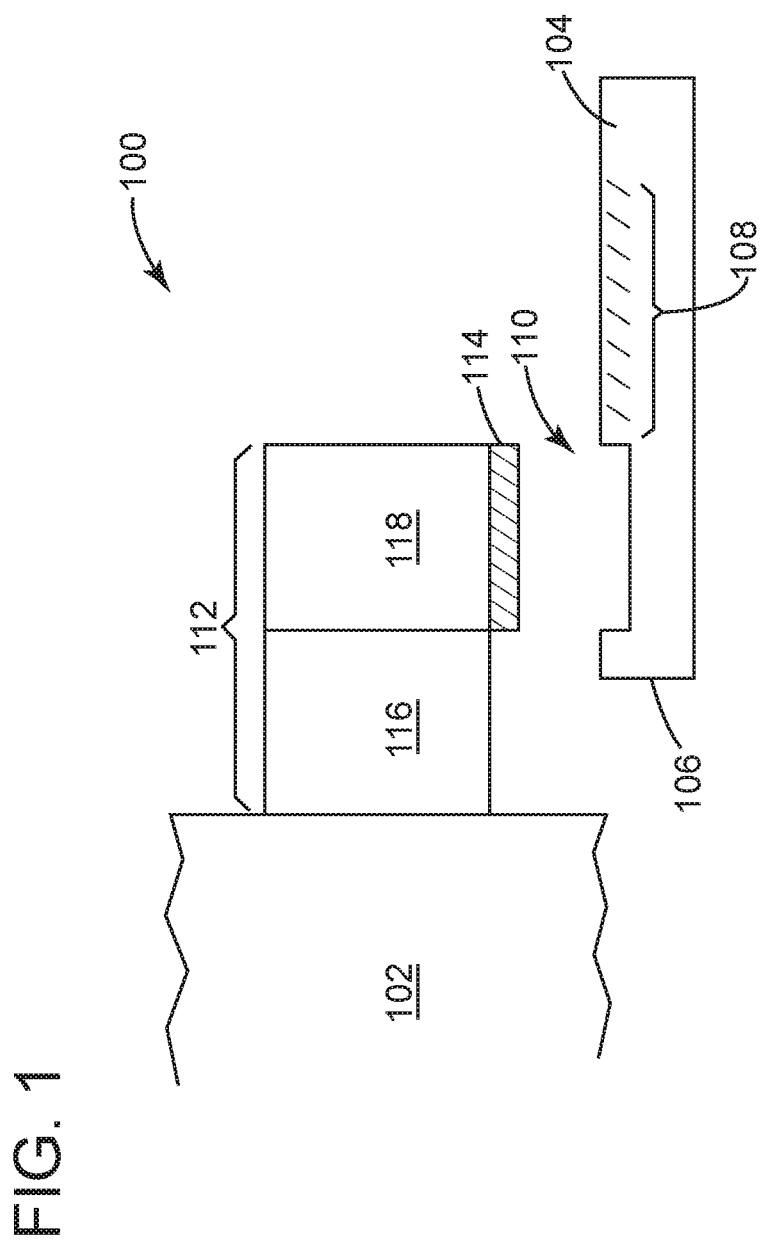

Where applicable, like reference characters designate identical or corresponding components and units throughout the several views, which are not to scale unless otherwise indicated. The embodiments disclosed herein may include elements that appear in one or more of the several views or in combinations of the several views. Moreover, methods are exemplary only and may be modified by, for example, reordering, adding, removing, and/or altering the individual stages.

DETAILED DESCRIPTION

"V-groove" couplers are features in optical circuitry to connect optical fibers to an integrated circuit (IC) device. These couplers include v-shaped grooves or channels in close proximity to the optical circuitry. The v-shape aligns the optical fibers with structure, like a waveguide. Processes to manufacture optical circuitry typically include steps to etch v-shaped grooves directly into a silicon wafer or like suitable substrate. Once complete, the process includes other steps to cut or "dice" the substrate into separate, individual IC devices for use in final package assembly.

This discussion describes embodiments to test or "probe" optical IC devices prior to dicing the wafer. These embodiments may employ a probe device to position optical fibers directly into the v-grooves to complete the probing for device-on-wafer tests. The probe device permits manufacture lines to completely populate the substrate with circuitry, including the v-groove couplers, before final tests that interrogate functionality of the finished IC devices on the wafer. Other embodiments are within the scope of this disclosure.

FIG. 1 depicts a schematic diagram of an exemplary embodiment of a probe device 100. This embodiment is shown as part of test or inspection equipment, identified generally by the numeral 102. Inspection equipment 102 may perform tests on a wafer 104. These tests may probe device-level circuitry set in from edge 106 of the wafer 104, for example, photonic integrated circuits (PICs) 108 with a v-groove optical coupler 110. As also shown, the probe device 100 may include a probe engagement mechanism 112 to locate optical fiber probes 114 into the v-groove optical coupler 110. The probe engagement mechanism 112 may include a probe holder 116 that couples a fiber holder 118 to inspection equipment 102.

Broadly, the probe device 100 may be configured to improve probing and testing processes for optical IC device tests. These configurations can interface directly with parts of the optical IC to exchange optical signals or "stimuli," like light. This feature permits probing to occur after manufacture of the optical IC devices are complete and covers the test for the optical interface of the chip IC that is used for module build. This feature may save on production costs because the interface forecloses the need to halt wafer production before fabrication of the optical interface (e.g., v-groove coupler) for the optical IC device is complete or to require design of any additional features into the optical IC circuitry.

Inspection equipment 102 can be configured to test or probe individual IC devices. These configurations may embody automated and manual systems with a probe head in proximity to a moveable platform that holds the wafer 104. During testing, the moveable platform translates the wafer 104 relative to the probe head. X-Y movement aligns PICs 108 for an IC device with the probe device 100. The moveable platform can then raise the wafer 104 (in the Z-direction) to engage the probe device 100 with the v-groove optical coupler 110. This process continues on a device-to-device basis across the entirety of wafer 104.

The probe engagement mechanism 112 can be configured to allow the optical fiber probes 114 to insert into the v-groove optical coupler 110. These configurations may embody devices that mount to the probe head of the probe system 102. The optical fiber probes 114 may embody thin, flexible, elongate fibers that have a round or circular cross-section. Optical signals can transit these fibers so that the probe system 102 can interrogate PICs 108 for each IC device on wafer 104.

The probe holder 116 can be configured to secure to the probe head. These configurations may embody devices that facilitate alignment of the optical fiber probes 114 with v-grooves on the v-groove coupler 110. For example, the device may precisely fix the location of the optical fiber probes 114 relative to the probe head. In one implementation, the device may allow the optical fiber probes 114 to "float" relative to the probe head. During on-wafer tests, this feature can accommodate for slight differences in the position of the optical fiber probes 114 (on the probe head) relative to the position of the v-groove couplers 110 on the wafer 104. This so-called "passive alignment" foregoes the need for realigning the optical fiber probes 114 at each individual optical IC on the wafer 104, either by manual intervention of an operator or a control program with motorized positioner or manipulator.

The fiber holder 118 can be configured to mount to the probe holder 116. These configurations may embody devices that hold the optical fiber probes 114. These devices may expose a majority of the circular cross-section of the optical fiber probes 114 in position to "fit" into the v-grooves of the v-groove coupler 110.

Figure 2:
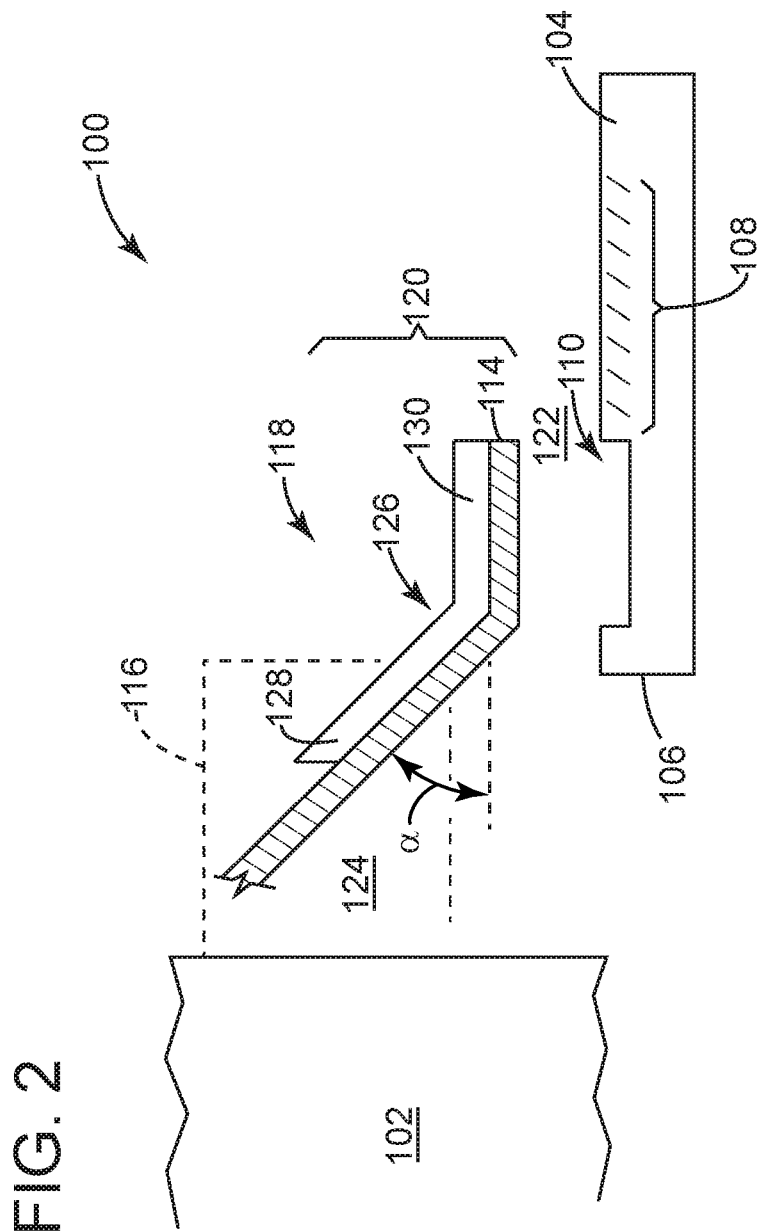

FIG. 2 depicts an elevation view from the side of an example of the fiber holder 118 for use in the probe device 100 of FIG. 1. This example may include a body 120 made of materials compatible with wafer probing applications. Preference may be given to silicon or ceramic. The body 120 may have ends (e.g., a first end 122 and a second end 124). The optical fiber probes 114 may affix to the bottom of the body 120, typically terminating proximate the first end 122 and extending beyond the second end 124 (to couple with parts of inspection equipment 102). The first end 122 may be polished after the fiber probes 114 attachment to keep the ends of all fiber probes 114 in the same plane. As also shown, the body 120 may bend or curve at a transition 126. This bend may separate the body 120 into two portions (e.g., a first portion 128 and a second portion 130). The portions 128, 130 may form integrally or monolithically with each other; however, it is possible to form the portions 128, 130 as separate pieces that affix with one another at the transition 126. Epoxy or like adhesive materials may secure these separate pieces together. In one implementation, the first portion 128 may couple with the probe holder 116. The second portion 130 may locate the optical fiber probes 114 below the bottom of the probe holder 116. This feature allows the exposed, planar section of the optical fiber probes 114 to fit or insert into the "opening" of the v-groove coupler 110 on wafer 104. The transition 126 may define an angle α that corresponds with dimensions (e.g., length) of this opening to ensure proper fit for the optical fiber probes 114. The angle α may also correspond with thresholds or bend radii for fibers used as the optical fiber probes 114 to prevent damage or interfere with transmission (or reception) of light. Suitable values for the angle α may fall in a range of from about 5° to about 20°.

Figure 3:
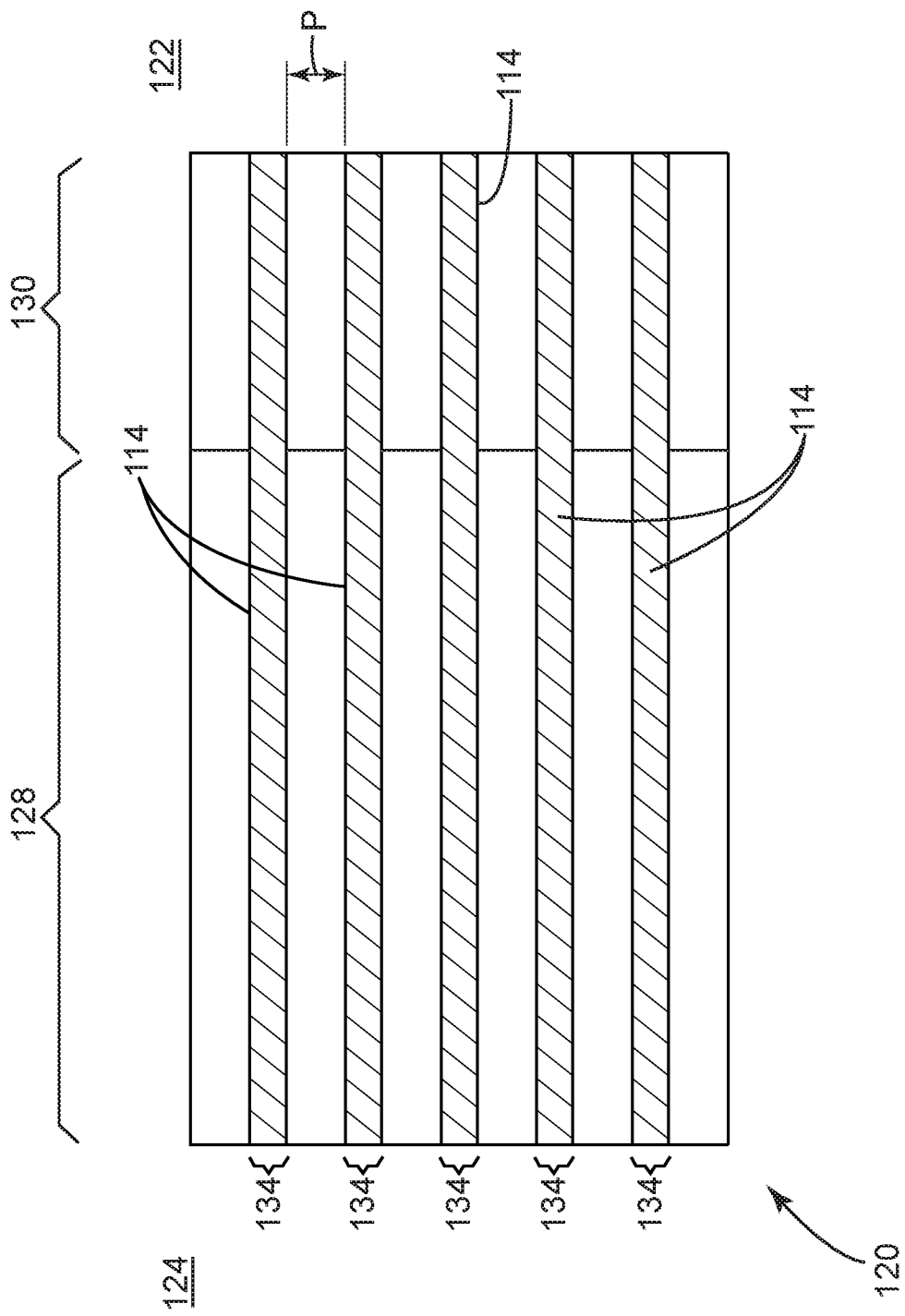

FIG. 3 shows a plan view of the bottom of the fiber holder 118 of FIG. 2. This example includes recess features 134, for example, grooves or depressions that penetrate into the body 120. The grooves 134 may extend along the entire length of the body 120. This construction may form openings at each of the ends 122, 124. As also shown, lateral spacing (or pitch P) may separate adjacent grooves 134. This lateral spacing may match the pitch of v-grooves found on the v-groove coupler 110. In use, the optical fiber probes 114 may insert or "lay" into the grooves 134. Layer(s) of adhesive may adhere the optical fiber probes 114 in position to fix distance between them and to prevent movement relative to the body 120.

Figure 4:
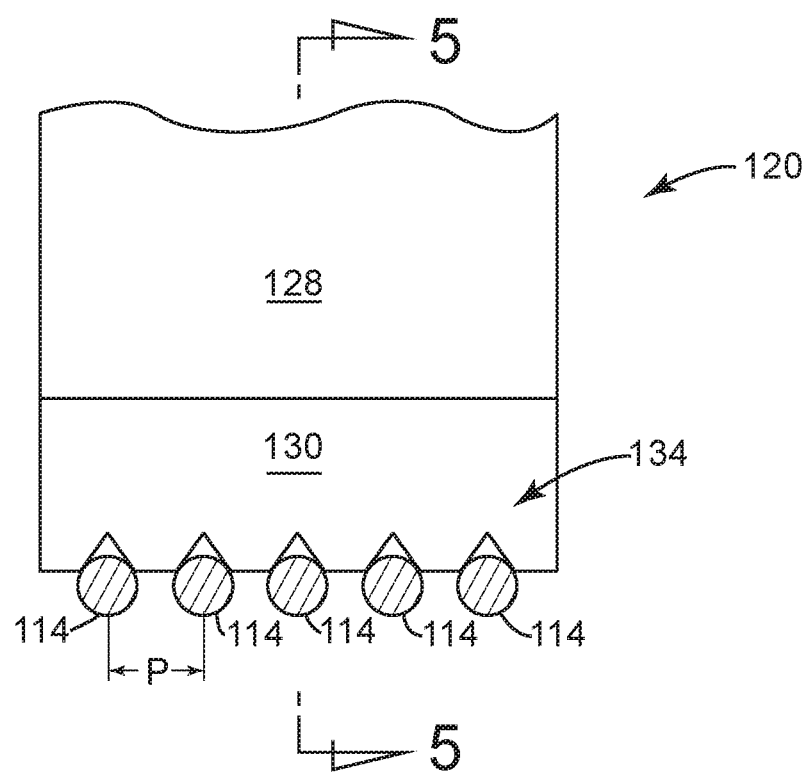

FIG. 4 depicts an elevation view from the front of the fiber holder 118 of FIG. 2. The grooves 134 may have a shape to accommodate the circular cross-section of the optical fiber probes 114. Preference may be given to a "v-shape" similar to the v-grooves of the coupler 110. This v-shape may have dimensions that allow more or less of the optical fiber probes 114 to reside or insert into the bottom of the body 120. These dimensions may vary lengthwise along the body 120.

Figure 5:
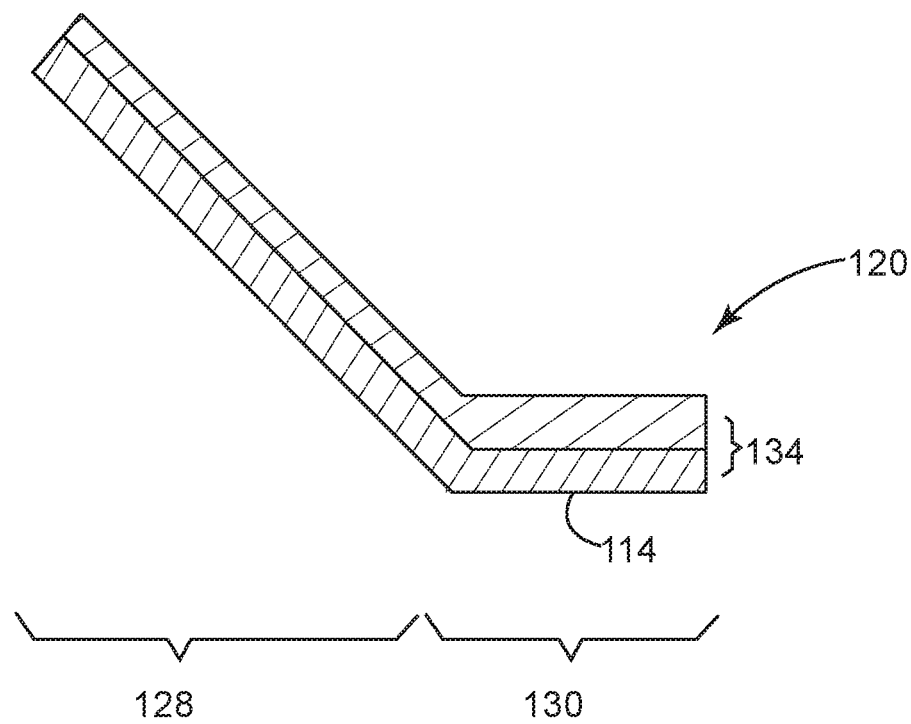

FIG. 5 depicts a cross section of the fiber holder 118 of FIG. 2. The grooves 134 may have a first set of dimensions in the first portion 128 and a second set of dimensions in the second portion 130. Values for the first set and the second set may cause more of the optical fiber probes 114 to set into the grooves 134 in the first portion 128 than the second portion 130. In one implementation, at least three quarters of the circular cross-section of the optical fiber probes 114 reside below the bottom of the body 120 in the second portion 130.

Figure 6:
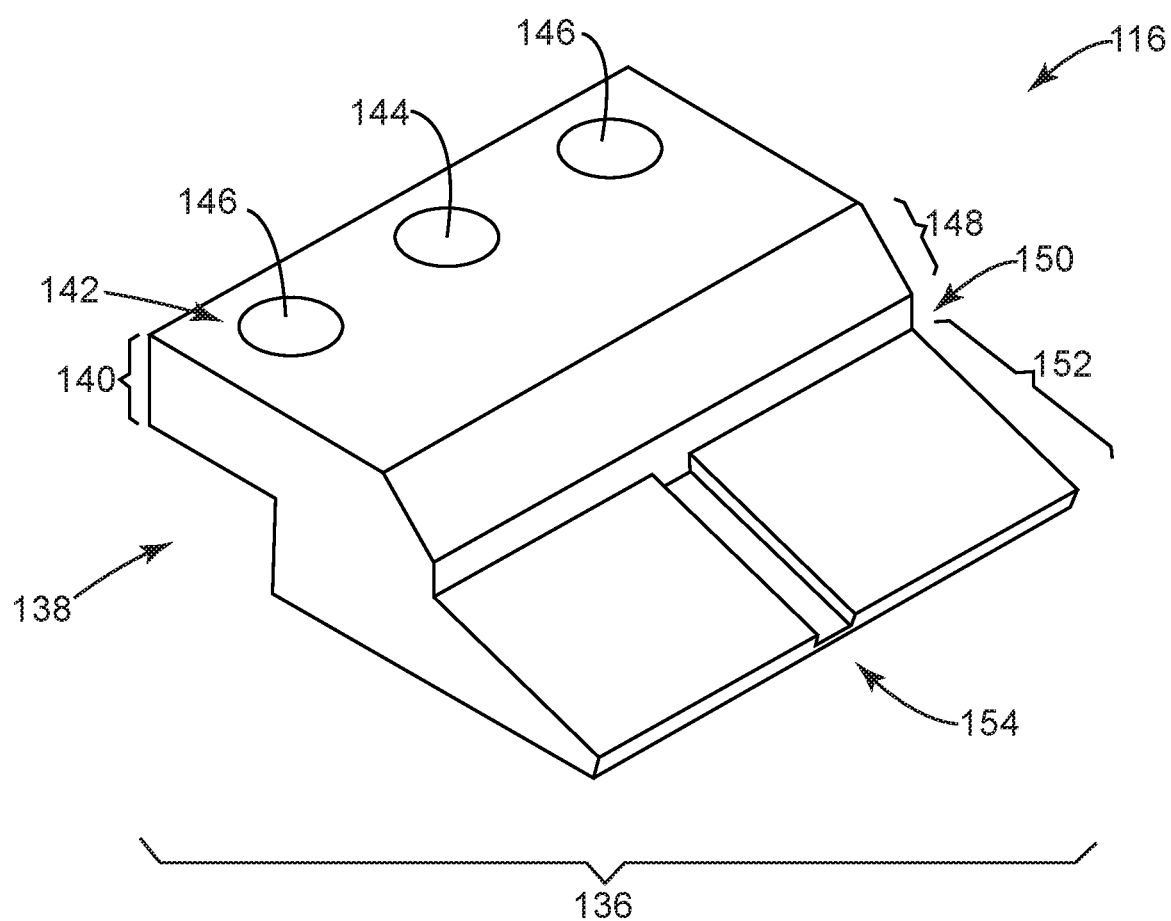
FIG. 6 depicts a perspective view of an example of a probe holder for use in the probe device of FIG. 1.

FIG. 6 depicts a perspective view of exemplary structure for the probe holder 116 for use in the probe device 100 of FIG. 1. This structure may include a body 136 made of metals, plastics, or composites. On one end, the body 136 may have a recess 138 that forms a thinned portion 140. One or more laterally-disposed apertures 142 may populate the thinned portion 140. The laterally-disposed apertures 142 may include an alignment hole 144 resident between a pair of mounting holes 146. Dimensions for the alignment hole 144 may benefit from tight-tolerances for size and position. Adjacent the thinned portion 140, the body 136 may include a chamfered portion 148 that terminates at a stepped-down portion 150. The body 136 may also have an angled portion 152 that abuts the stepped-down portion 150 A slot 154 may penetrate into the body 136 in the angled portion 152 from the stepped-down portion 150.

Figure 7:
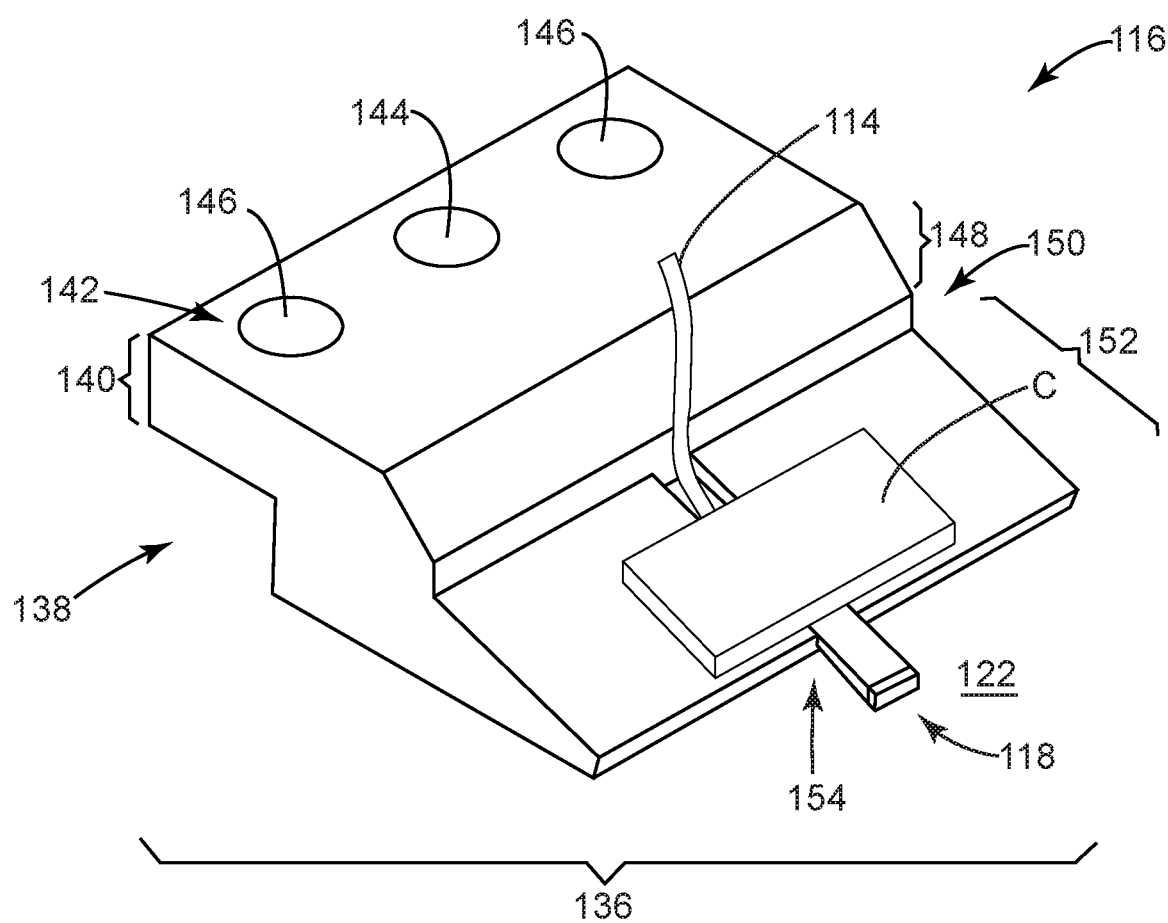
FIG. 7 depicts the probe holder of FIG. 6 as part of an assembly for use as the probe device of FIG. 1.

FIG. 7 shows the body 136 of FIG. 6 as part of an assembly for use in the probe device 100 of FIG. 1. In this assembly, the fiber holder 118 may insert into the slot 154 with the first end 122 spaced apart from the body 136. A cover C may extend over the fiber holder 118. Epoxy or adhesive, or screws with mounting holes added to cover C and the body 136, may affix the cover C to the angled portion 152. Additional epoxy may also find use to secure the fiber holder 118 in the slot 154 as well. The mounting holes 144, 146 may interface with corresponding mounting features or locations on the inspection equipment 102. In one implementation, the alignment hole 144 may accept a precisely-machined pin or boss resident on a positioner or manipulator of inspection equipment 102. This pin fixes the position of the body 136 relative to other parts of inspection equipment 102, for example, the moveable stage that translates wafer 104 relative to the positioner or manipulator, or positioner or manipulator may fine move the body 136 relative to the wafer 104. The mounting holes 146 may provide clearance for fasteners (e.g., bolts and screws) to extend through the body 136. The recess 138 may accommodate a nut with threads compatible with these fasteners to secure the body 136 in position on inspection equipment 102.

Figure 8:
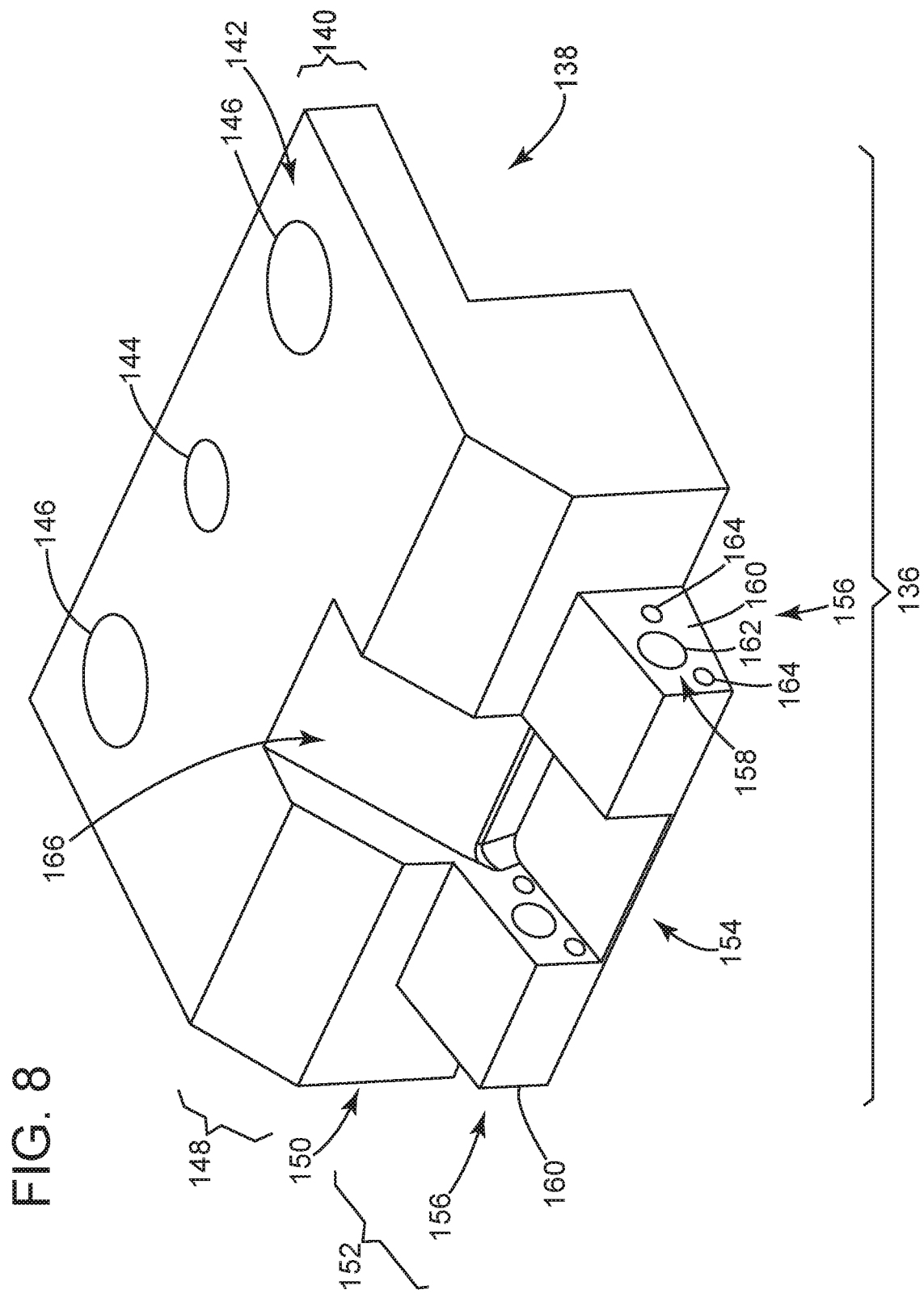
FIG. 8 depicts a perspective view of another example of a probe holder for use in the probe device of FIG. 1.

FIG. 8 depicts a perspective view of another example of the body 136 for use in the probe device 100 of FIG. 1. This example may include a pair of lateral cut-outs 156 on either side of the slot 154 in the angled portion 152. Apertures 158 may penetrate side surfaces 160 of the angled portion 152 as well. The apertures 158 may embody through-holes that form openings on interior surfaces of the slot 154. The through-holes 158 may include a threaded hole 162 disposed between a pair of laterally-spaced pin holes 164. The portions 148, 150 may include a second slot 166 that extends from the first slot 154 to the top of the thinned portion 140.

Figure 9:
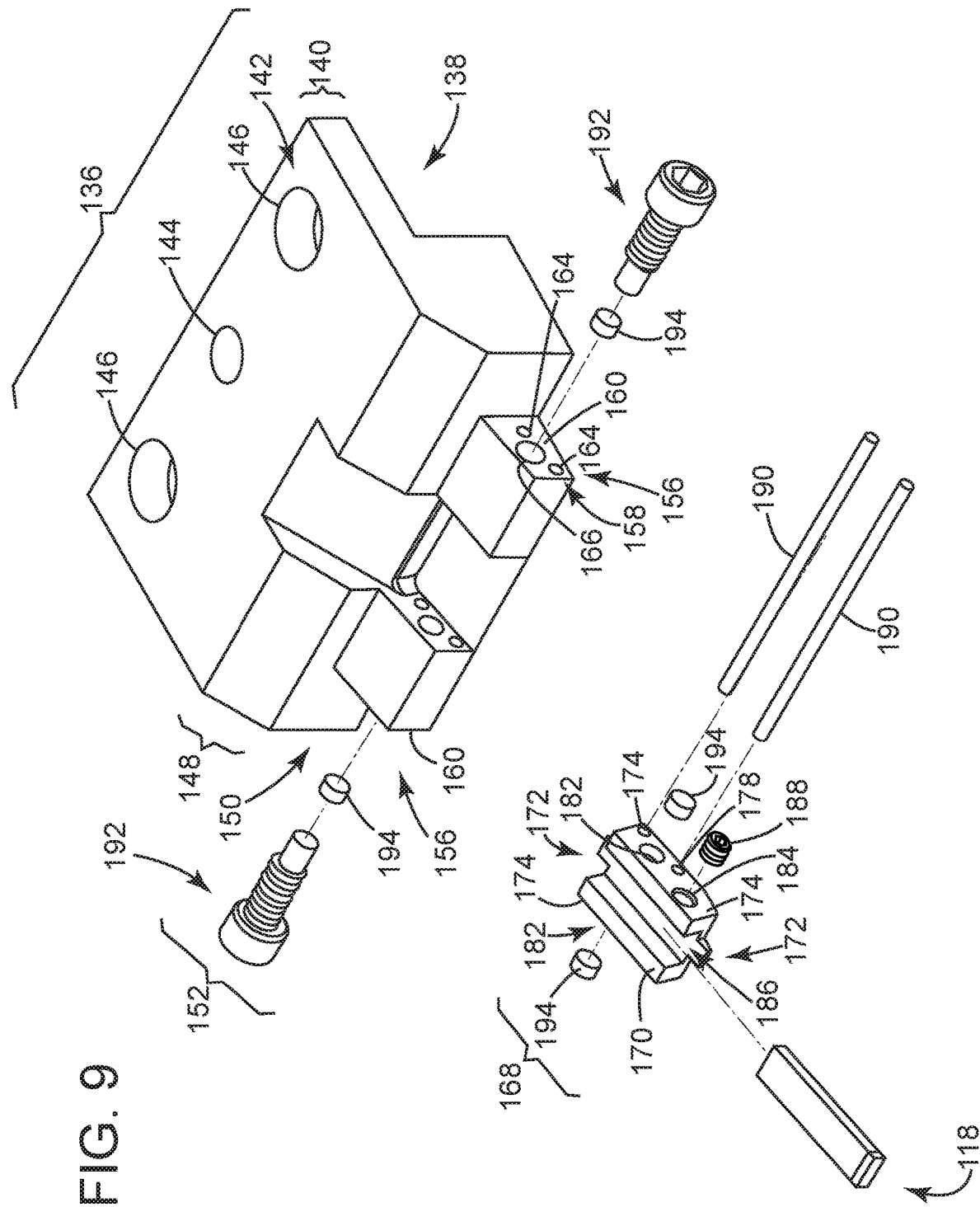
FIG. 9 depicts the probe holder of FIG. 8 as part of an assembly for use as the probe device of FIG. 1.

FIG. 9 shows the body 136 of FIG. 8 as part of an assembly for use in the probe device 100 of FIG. 1 in exploded form. This assembly includes a moveable carriage 168 with a block 170 having forward and rearward protruding bosses 172. The block 170 may also have sides 174 with a pair of pin holes 178 that extend therebetween. A pair of axially-aligned depressions 182 may prevail as well. The block 170 may also have a threaded hole 184 that penetrates from one of the sides 174 to a centrally-located slot 186. As also shown, the assembly may include a set screw 188 and pins 190, preferably elongate, cylindrical rods. The assembly may also include a pair of threaded fasteners 192 and magnets 194.

Figure 10:
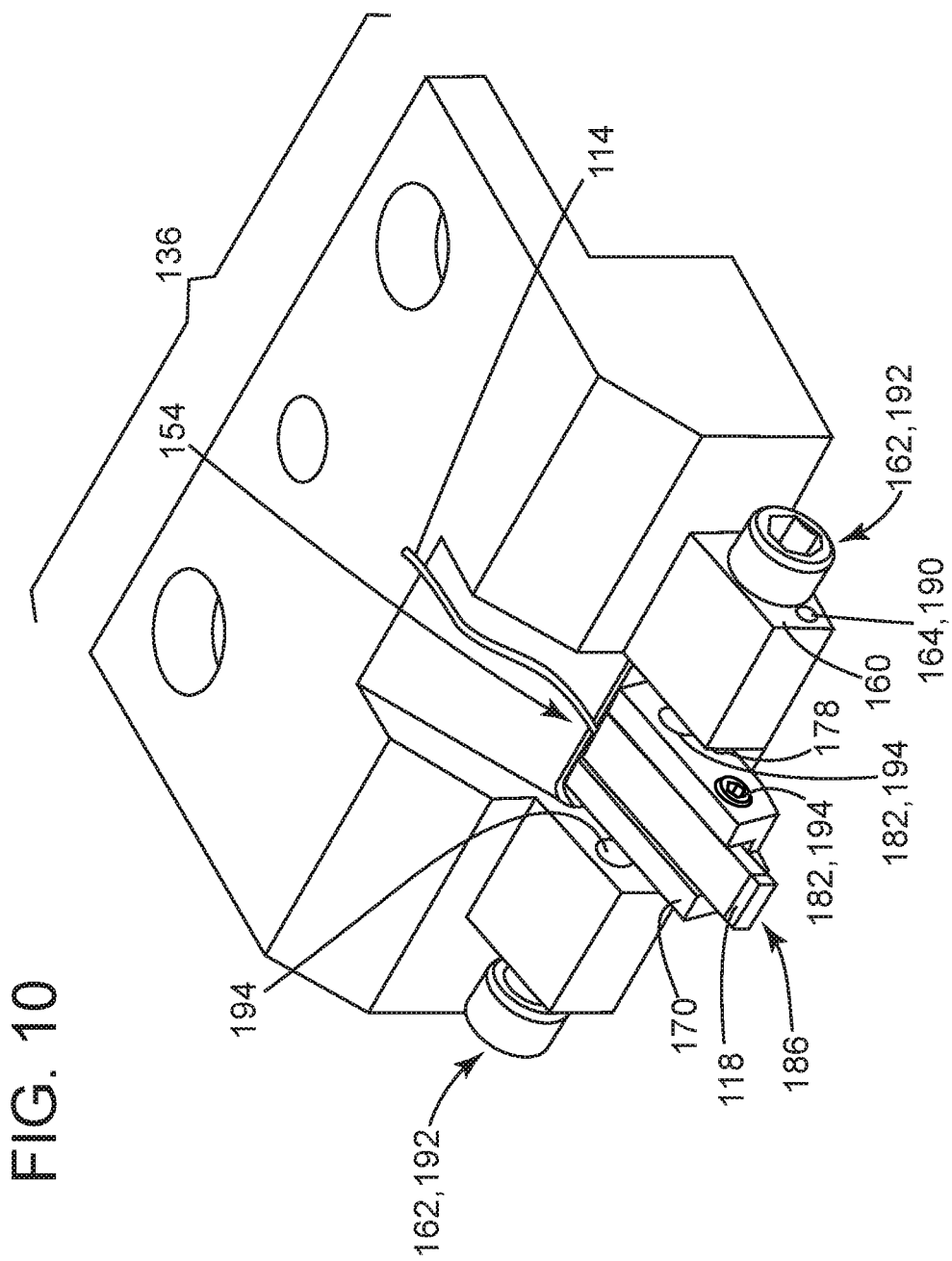
FIG. 10 depicts the assembly of FIG. 9 in assembled form.

FIG. 10 depicts the assembly of FIG. 9 in assembled form. The fiber holder 118 may fit into the centrally-located slot 186 on the block 170. Set screw 188 may insert into threaded hole 184 to bias the fiber holder 118 to one side of the slot 186. A first set of magnets 194 may insert into the axially-aligned depressions 182. The block 170 may reside in the slot 154 of the body 136. Rods 190 may insert into pin holes 164 on side surfaces 160 and through the pin holes 178 of the block 170. The rods 190 may prevent longitudinal movement of the block 170. However, dimensions for pin holes 178 (and rods 190) may accommodate lateral or side-to-side movement within the slot 154. Fasteners 192 may insert into the threaded hole 162 on opposite sides 160. A second set of magnets 194 may affix to ends of the fasteners 192 found proximate the slot 154.

Figure 11:
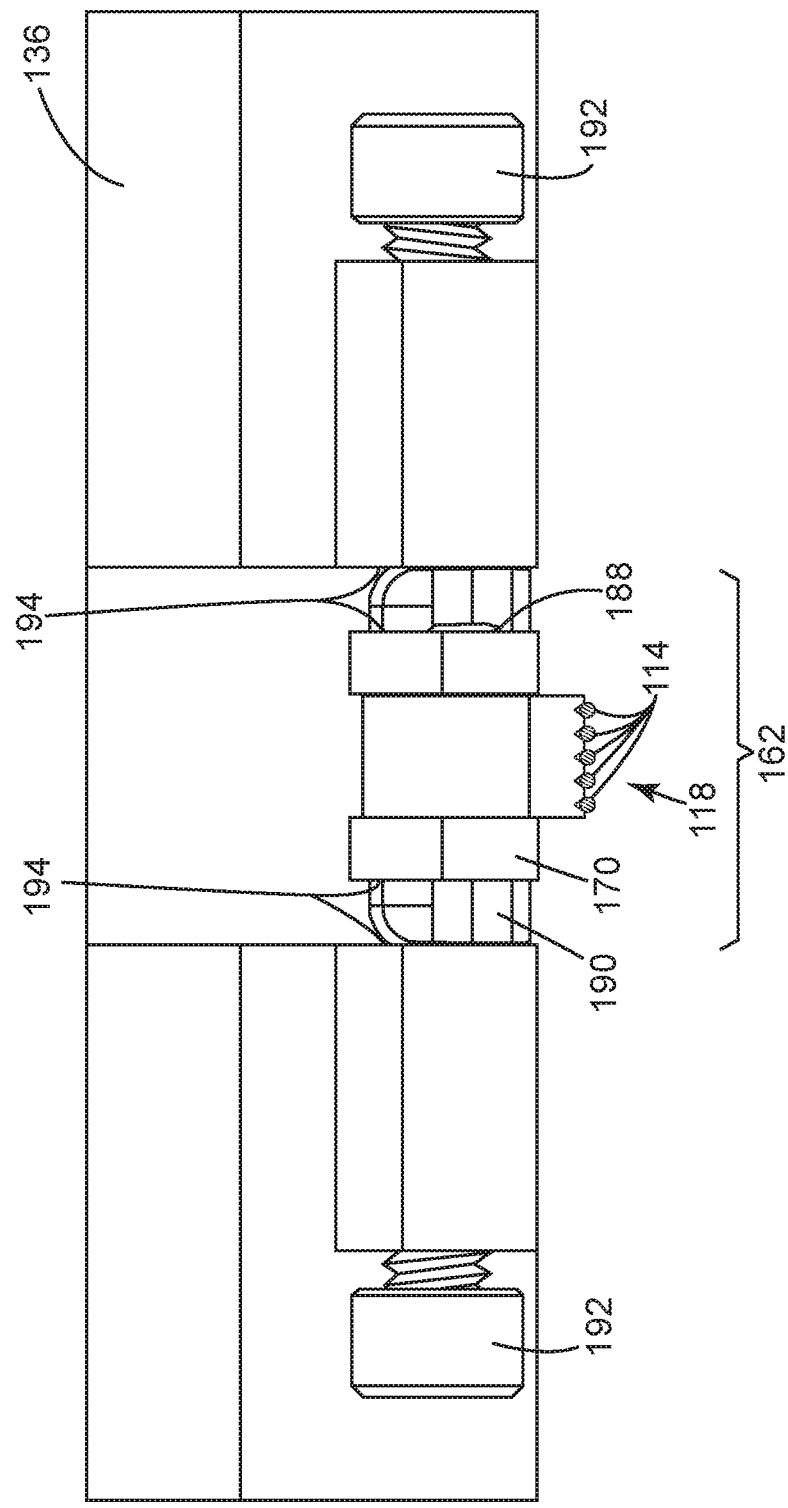
FIG. 11 depicts an elevation view from the front of the assembly of FIG. 10.

FIG. 11 shows an elevation view from the front of the assembly of FIG. 10. The arrangement of magnets 194 forms an adjustment mechanism to facilitate lateral adjustment and self-alignment of the fiber holder 118. The adjustment mechanism may leverage non-contact modalities (e.g., magnetics), but contact or other techniques that can move the moveable carriage 162 is also permissible. Magnetics may be particularly useful to permit both active and passive adjustment of the moveable carriage 162 in the slot 154. In one implementation, the first set of magnets on the moveable carriage 162 and the second set of magnets on the fasteners 192 generate opposing magnetic fields. Active adjustment may occur in response to actuation of the threaded fasteners 192 by an end user (e.g., technician), for example, as part of set-up of inspection equipment 102. To move the moveable carriage 162 to left or right in the diagram, for example, the technician may rotate the fasteners 192 in appropriate directions so that the opposing fields effectively "push" the moveable carriage 162 into a position desired in the slot 154. Passive movement may occur in response to slight misalignment between the optical fiber probes 114 and the v-groove coupler 110 on the wafer 104. Magnets 194 may be selected so that the strength of the opposing magnetic fields is overcome and the moveable carriage 162 can change position slightly (either left or right in the diagram) in response to contact between the optical fiber probes 114 and the v-grooves (or other structure) as the moveable platform moves the wafer 104 upwards to engage with the probe device 100.

In light of the foregoing discussion, the embodiments provide a solution to address problems with on-wafer probing of optical IC. The solution herein contemplates probe devices that allow the optical fiber probes to engage directly with v-groove couplers found as part of the optical IC. As a result, device fabrication can continue to complete all IC on the wafer. This features can reduce manufacturing costs, thus reducing overall costs of the chip IC devices that are used in final package or module assembly.

This written description uses examples to disclose the invention, including the best mode, and also to enable any person skilled in the art to practice the invention, including making and using any devices or systems and performing any incorporated methods. An element or function recited in the singular and proceeded with the word "a" or "an" should be understood as not excluding plural said elements or functions, unless such exclusion is explicitly recited. References to "one embodiment" of the claimed invention should not be interpreted as excluding the existence of additional embodiments that also incorporate the recited features. Furthermore, the claims are but some examples that define the patentable scope of the invention. This scope may include and contemplate other examples that occur to those skilled in the art. Such other examples are intended to be within the scope of the claims if they have structural elements that do not differ from the literal language of the claims, or if they include equivalent structural elements with insubstantial differences from the literal language of the claims.

Examples appear below that include certain elements or clauses one or more of which may be combined with other elements and clauses describe embodiments contemplated within the scope and spirit of this disclosure.

What is claimed is:

1. A fiber optic wafer probe, comprising:
a probe holder comprising an angled portion with a slot; and
a fiber holder insertable into the slot, the fiber holder comprising a body with a first portion and second portion disposed at an angle relative to one another so that the first portion is shorter than the second portion, the body having a bottom with grooves disposed therein, the grooves having dimensions to receive part of an optical fiber therein,
wherein the grooves in the first portion are parallel to v-grooves of a v-groove coupler on a wafer with the first portion of the fiber holder disposed in the v-groove optical coupler on the wafer.

2. The fiber optic wafer probe of claim 1, wherein the grooves having a v-shape cross-section.

3. The fiber optic wafer probe of claim 1, wherein the grooves extend between openings on each end of the body.

4. The fiber optic wafer probe of claim 1, wherein dimensions for the grooves are different as between the first portion and the second portion.

5. The fiber optic wafer probe of claim 1, wherein the grooves are spaced apart from one another at a pitch that matches features of a v-groove optical coupler on a wafer.

6. The fiber optic wafer probe of claim 1, wherein the fiber holder is laterally moveable in the slot.

7. The fiber optic wafer probe of claim 1, wherein the probe holder generates a magnetic field into the slot.

8. The fiber optic wafer probe of claim 1, wherein fiber holder generates a magnetic field into the slot.

9. The fiber optic wafer probe of claim 1, wherein the body comprises two pieces adjoined with one another at a transition that forms the angle, the two pieces corresponding to the first portion and the second portion.

10. The fiber optic wafer probe of claim 1, wherein the first portion resides outside of the slot of the angled portion of the probe holder.

11. The fiber optic wafer probe of claim 1, wherein the bottom of the body at the first portion is below the probe holder.

12. A kit, comprising:
- a probe holder having apertures to receive an alignment pin found on a probe head of wafer inspection test equipment; and
- a fiber holder comprising a body having a first portion and a second portion disposed at an angle from one another, the body having a bottom side with v-grooves on one side, the fiber holder further comprising optical fiber probes disposed in the v-grooves, wherein dimensions for the v-grooves expose more of the optical fiber probes below the bottom side in the first portion than the second portion,
- wherein the v-grooves in the first portion are parallel to v-grooves of a v-groove coupler on a wafer with the first portion of the fiber holder disposed in the v-groove optical coupler on the wafer.

13. The kit of claim 12, wherein the fiber holder attaches to the probe holder so as to allow the fiber holder to move laterally relative to the probe holder when on the probe head.

14. The kit of claim 12, further comprising:
- a movable carriage adapted to receive the fiber holder;
- magnets; and
- fasteners,
- wherein the magnets and the fasteners form an adjustment mechanism to move the optical fiber probes laterally relative to the probe holder.

* * * * *